(12) United States Patent
Anderson et al.

(10) Patent No.: US 9,970,973 B2
(45) Date of Patent: May 15, 2018

(54) ATOM-BASED ELECTROMAGNETIC RADIATION ELECTRIC-FIELD AND POWER SENSOR

(71) Applicant: The Regents of The University of Michigan, Ann Arbor, MI (US)

(72) Inventors: David A. Anderson, Ann Arbor, MI (US); Georg A. Raithel, Ann Arbor, MI (US); Nithiwadee Thaicharoen, Ann Arbor, MI (US); Stephanie A. Miller, Ann Arbor, MI (US); Andrew Schwarzkopf, Gaithersburg, MD (US)

(73) Assignee: The Regents of The University of Michigan, Ann Arbor, MI (US)

( * ) Notice: Subject to any disclaimer, the term of this patent is extended or adjusted under 35 U.S.C. 154(b) by 0 days. days.

(21) Appl. No.: 15/783,419

(22) Filed: Oct. 13, 2017

(65) Prior Publication Data
US 2018/0031620 A1 Feb. 1, 2018

Related U.S. Application Data

(63) Continuation of application No. 15/183,010, filed on Jun. 15, 2016, now abandoned.

(60) Provisional application No. 62/175,805, filed on Jun. 15, 2015.

(51) Int. Cl.
*G01R 13/38* (2006.01)
*G01R 29/08* (2006.01)

(52) U.S. Cl.
CPC .............................. *G01R 29/0885* (2013.01)

(58) Field of Classification Search
CPC ........ G01R 33/24; G01R 33/26; G01R 33/32; G01R 29/0885; G01N 21/63; H01J 29/45
See application file for complete search history.

(56) References Cited

U.S. PATENT DOCUMENTS

| 4,024,396 A | 5/1977 | Hill et al. |
| 8,212,556 B1 | 7/2012 | Schwindt et al. |
| 8,638,177 B2 | 1/2014 | Nishida |

(Continued)

OTHER PUBLICATIONS

J. A. Sedlacek et al Atom-Based Vector Microwave Electrometry Using Rubidium Rydberg Atoms in a Vapor Cell, PRL 111, 063001 (Aug. 6, 2013).

(Continued)

*Primary Examiner* — Minh N Tang
(74) *Attorney, Agent, or Firm* — Harness, Dickey & Pierce, P.L.C.

(57) ABSTRACT

A method is presented for measuring the electric field of electromagnetic radiation using the spectroscopic responses of Rydberg atoms to the electromagnetic radiation field. The method entails implementing quantitative models of the Rydberg atom response to the electromagnetic radiation field to provide predetermined atomic properties or spectra for field amplitudes and or frequencies of interest, spectroscopically measuring the response (spectrum) of Rydberg atoms exposed to an unknown electromagnetic radiation field, and obtaining the electric field amplitude and/or frequency of the unknown electromagnetic radiation by using features extracted from the measured spectrum and comparing them to features in a predetermined spectrum among the set of predetermined spectra.

19 Claims, 8 Drawing Sheets

(56) References Cited

U.S. PATENT DOCUMENTS

| | | | |
|---|---|---|---|
| 8,760,159 B2* | 6/2014 | Tuchman | G01R 33/032 324/304 |
| 2004/0012388 A1 | 1/2004 | Pedersen | |
| 2011/0057737 A1 | 3/2011 | Aoyama et al. | |
| 2011/0057767 A1 | 3/2011 | Ryu et al. | |
| 2011/0279115 A1 | 11/2011 | Tuchman | |

OTHER PUBLICATIONS

A. K. Mohapatra et al "Coherent Optical Detection of Highly Excited Rydberg States Using Electromagnetically Induced Transparency", PRL 98, 113003 (Mar. 15, 2007).

Jonathon A. Sedlacek et al "Microwave electrometry with Rydberg atoms in a vapour cellusing bright atomic resonances", Nature Physics, vol. 8 (Nov. 2012).

M. G. Bason et al "Enhanced Electric Field Sensitivity of RF-dressed Rydberg Dark States", New Hournal of Physics 12, 065015 (Jun. 28, 2010).

D. A. Anderson et al "Two-photon Microwave Transitions and Strong-Field Effects in a Room-Temperature Rydberg-Atom Gas", Physical Review A 90, 043419 (Oct. 29, 2014).

Josha A. Gordon et al "Millimeter Wave Detection Via Autler-Townes Splitting in Rubidium Rydberg Atoms", Applied Physics Letters 105, 024104 (Jul. 17, 2014).

Christopher L. Holloway et al "Sub-wavelength Imaging and Field Mapping Via Electromagnetically Induced Transparency and Autler-Townes Splitting in Rydberg Atoms", Applied Physics Letters 104, 244102 (Jun. 16, 2014).

Christopher L. Hollloway, et al., "Broadband Rydberg Atom-Based Electric-Field Probe for SI-Traceable, Self-Calibrated Measurements", IEEE Transactions on Antennas and Propagation, 2014, vol. 62, pp. 6169-6182.

* cited by examiner

FIG. 5
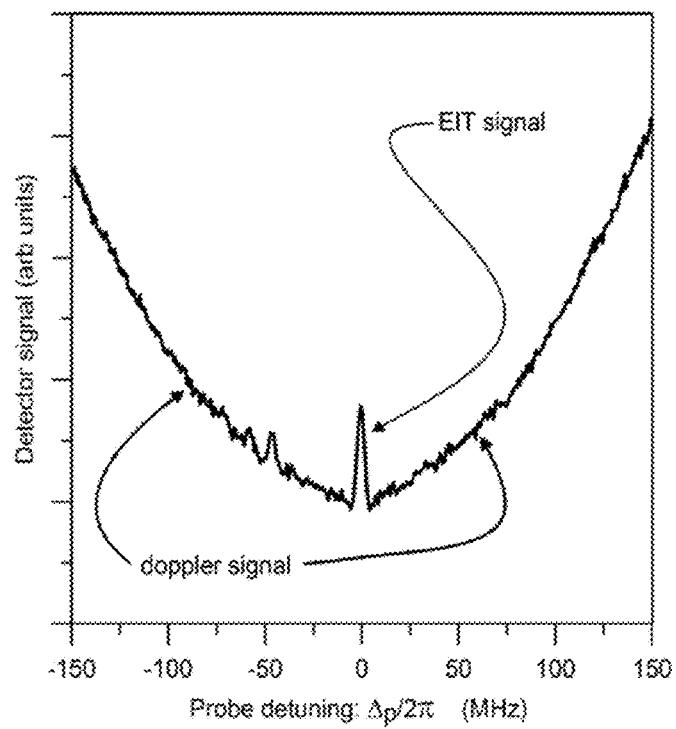
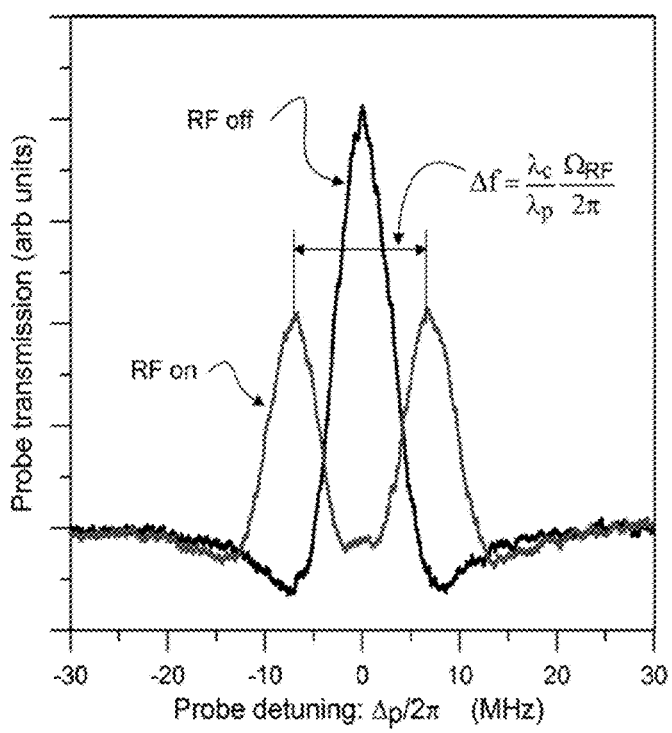
FIG. 6

ATOM-BASED ELECTROMAGNETIC RADIATION ELECTRIC-FIELD AND POWER SENSOR

CROSS-REFERENCE TO RELATED APPLICATIONS

This application is a continuation of U.S. patent application Ser. No. 15/183,010 filed Jun. 15, 2016 abandoned which claims the benefit of U.S. Provisional Application No. 62/175,805, filed on Jun. 15, 2016. The entire disclosures of the above applications are incorporated herein by reference.

FIELD

The present disclosure relates to a technique for measuring the electric field (or frequency) of electromagnetic radiation using the response of Rydberg atoms.

BACKGROUND

Significant progress has been made in recent years towards establishing atomic measurement standards for field quantities. Rydberg atoms hold particular appeal for applications in electrometry due to their large transition electric dipole moments, which lead to a strong atomic response to electric (E) fields. Rydberg electromagnetically induced transparency (EIT) in atomic vapors has recently been demonstrated by applicants as a practical approach to absolute measurements of radio-frequency (RF) E fields over a broad frequency range (10 MHz to 500 GHz) and dynamic range (~100 mV/m to >1 kV/m) suitable for the development of calibration-free broadband RF sensors. The utility of the Rydberg EIT technique in characterizing RF E fields has been demonstrated in a number of applications. These include microwave polarization measurements, millimeter-wave (mm-wave) sensing, and subwavelength imaging. The approach has also been employed in room-temperature studies of multiphoton transitions in Rydberg atoms, as well as in measurements of static E fields for precise determinations of quantum defects.

The Rydberg EIT measurement technique has been employed in measurements of weak RF fields. In the weak-field regime, the atom-field interaction strength is small compared to the Rydberg energy-level structure, and the level shifts of the relevant coupled atom-field states are well described using perturbation theory. By exploiting near-resonant and resonant dipole transitions between high-lying Rydberg levels, which elicit a maximal atomic response, RF fields from as small as approximately 100 mV/m to a few tens of V/m have been measured. For measurements of strong RF E fields, the atom-field interaction cannot be modeled using perturbative methods and requires a non-perturbative method to accurately describe the response of the atomic system. Extending the atom-based measurement approach to a high-power regime could enable, for example, subwavelength characterizations of antennas radiating high-power microwaves among other applications.

This section provides background information related to the present disclosure which is not necessarily prior art.

SUMMARY

This section provides a general summary of the disclosure, and is not a comprehensive disclosure of its full scope or all of its features.

A method is presented for measuring the electric field of electromagnetic radiation using the spectroscopic responses of Rydberg atoms. The method includes: providing predetermined atomic spectra for atoms of a known type; placing the atoms within the unknown electromagnetic radiation field to be measured, where the atoms are in a gaseous state and contained in a vacuum enclosure; propagating one or more light beams through the atoms, where at least one light beam is coupled to a Rydberg state; measuring an atomic spectrum using the one or more light beams while the unknown electromagnetic radiation is interacting with or has interacted with the atoms; analyzing the measured atomic spectrum to extract spectral features; comparing the spectral features from the measured atomic spectrum to spectral features of the predetermined atomic spectra; matching the measured atomic spectrum to a given spectrum in the predetermined atomic spectra; and quantifying at least one of field strength or frequency of the unknown electromagnetic radiation field using the given spectrum and the predetermined atomic spectra.

Predetermined atomic spectra for the atoms are models of atomic responses in presence of the electromagnetic radiation. In one embodiment, the predetermined atomic spectra are calculated at a fixed frequency for a range of electric field values. In another embodiment, the predetermined atomic spectra are calculated at a fixed electric field for a range of frequencies. In some embodiments, the predetermined atomic spectra are calculated using Floquet theory.

In some embodiments, the atomic spectrum can be measured using electromagnetically induced transparency. For example, a probing light beam is propagated through the atoms, where the probing light beam has a frequency resonant with transition of the atoms from a first quantum state to a second quantum state; a coupling light beam is propagated through the atoms simultaneously with the probing light beam, where the coupling light beam is overlapped spatially with the probing light beam, frequency of the coupling light beam is scanned across a range in which atoms transition from the second quantum state to a Rydberg state; and the probing light beam passing though the atoms is detected using a light detector. In another example, a probing light beam is propagated through the atoms, where frequency of the probing light beam is scanned across a range in which atoms transition from a first quantum state to a second quantum state; a coupling light beam is propagated through the atoms concurrently with the probing light beam, where the coupling light beam is overlapped spatially with the probing light beam, frequency of the coupling light beam is resonant with transition of the atoms from the second quantum state to a Rydberg state; and the probing light beam passing though the atoms is detected using a light detector.

In one aspect of this disclosure, spectral features extracted from the measured atomic spectrum are further defined as the frequency difference between two split peak pairs in the measured atomic spectrum. These spectral features can be compared by overlaying the predetermined atomic spectra onto the measured atomic spectrum and shifting the predetermined atomic spectra such that the predetermined atomic spectra aligns with the measured atomic spectrum. In this case, field strength of the unknown electromagnetic radiation field can be quantified by determining Rabi frequency from a splitting of a Rydberg line in the measured atomic spectrum, calculating dipole moment of the relevant Rydberg transition, and computing magnitude of field strength of the unknown electromagnetic radiation field from the Rabi frequency and the dipole moment.

In another aspect of this disclosure, the spectral features extracted from the measured atomic spectrum are further defined as one or more of peak heights, peak widths and relative peak positions in a Floquet map. These spectral features can be compared by overlaying the predetermined atomic spectra onto the measured atomic spectrum, shifting the predetermined atomic spectra in relation to the measured atomic spectrum so that the spectral features are in agreement, thereby yielding the field strength or frequency of the unknown electromagnetic field.

A system is also presented for measuring the electric field of electromagnetic radiation using spectroscopic responses of Rydberg atoms. The system includes: a vapor cell containing atoms of a known type; a source of electromagnetic radiation arranged to emit electromagnetic radiation towards the vapor cell; a probing light source configured to propagate a probing light beam through the vapor cell, where frequency of the probing light beam is scanned across a range in which the atoms transition from a first quantum state to a second quantum state; a coupling light source configured to propagate a coupling light beam through the vapor cell concurrently with the probing light beam, where the coupling light beam is counterpropagating to and overlapped spatially with the probing light beam, and frequency of the coupling light beam is resonant with transition of the atoms from the second quantum state to a Rydberg state; a light detector configured to receive the probing light beam after passing through the vapor cell; a data store that stores predetermined atomic spectra for the atoms in the presence of the electromagnetic radiation; and a data processor in data communication with the light detector and the data store. The data processor measures an atomic spectrum for the atoms from the probing light beam received from the light detector and analyzes the measured atomic spectrum to extract spectral features. The data processor also compares the spectral features from the measured atomic spectrum to spectral features of the predetermined atomic spectra; and matches the measured atomic spectrum to a given spectrum in the predetermined atomic spectra, thereby quantifying one of field strength or frequency of the unknown electromagnetic radiation field.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 5 is a graph showing a probe transmission as a function of $\Delta_p$ for the three-level $$5S_{1/2} - 5P_{\frac{3}{2}} - 50D$$

Figure 7:
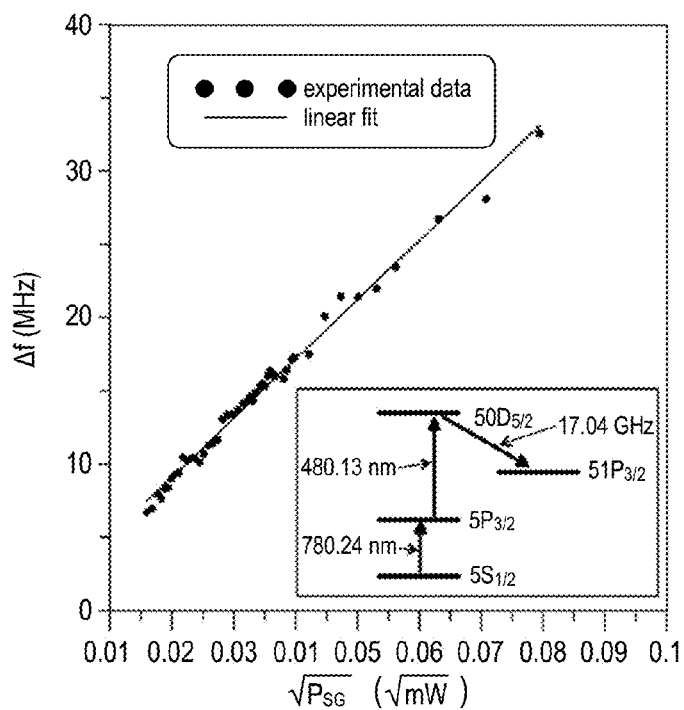
Figure 8:
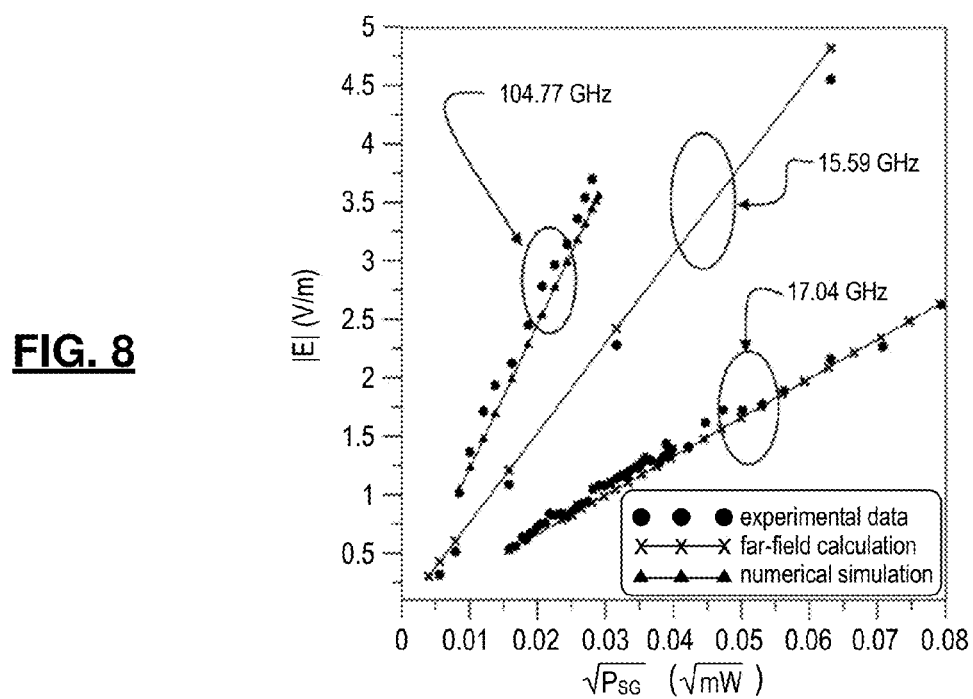
Figure 9A:
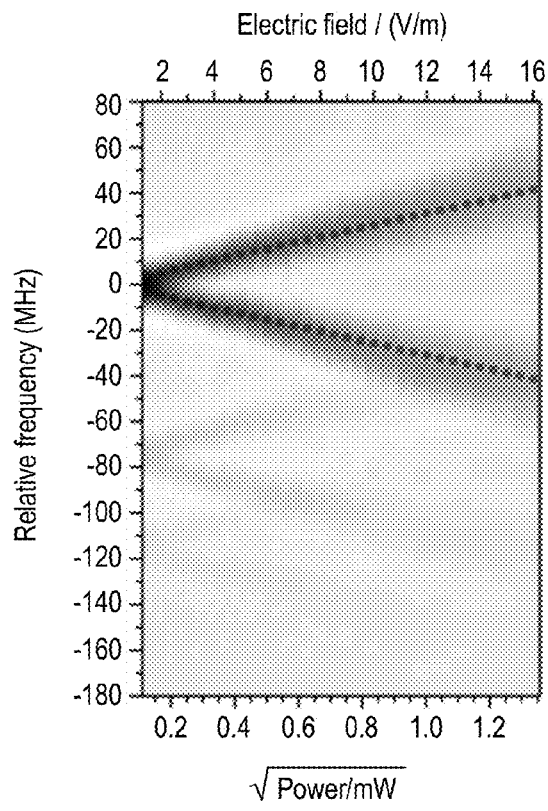
Figure 9B:
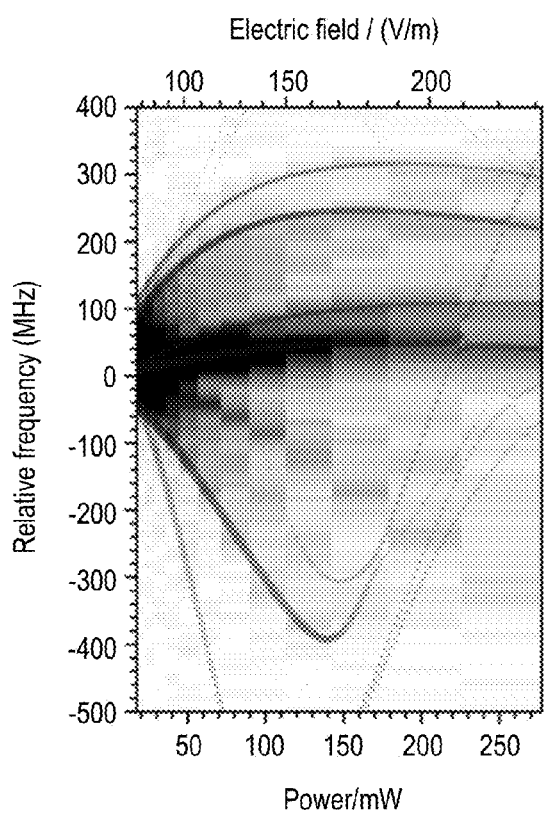
Figure 10:
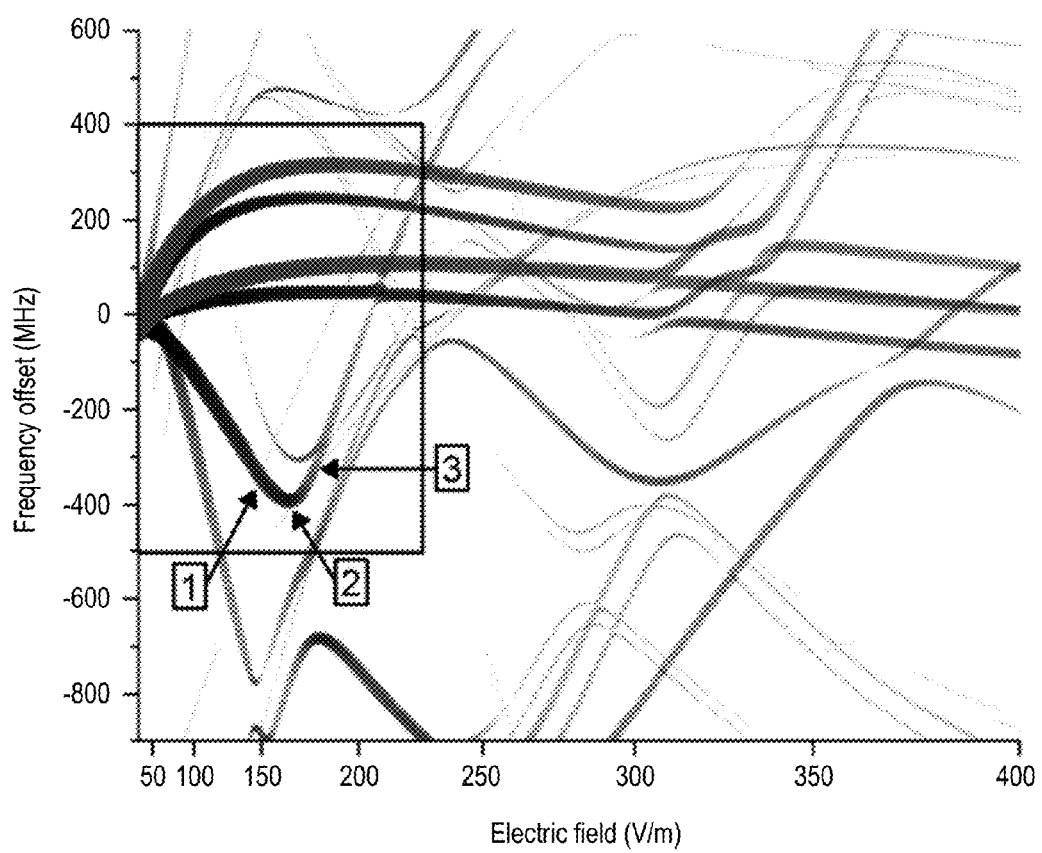
Figure 11A:
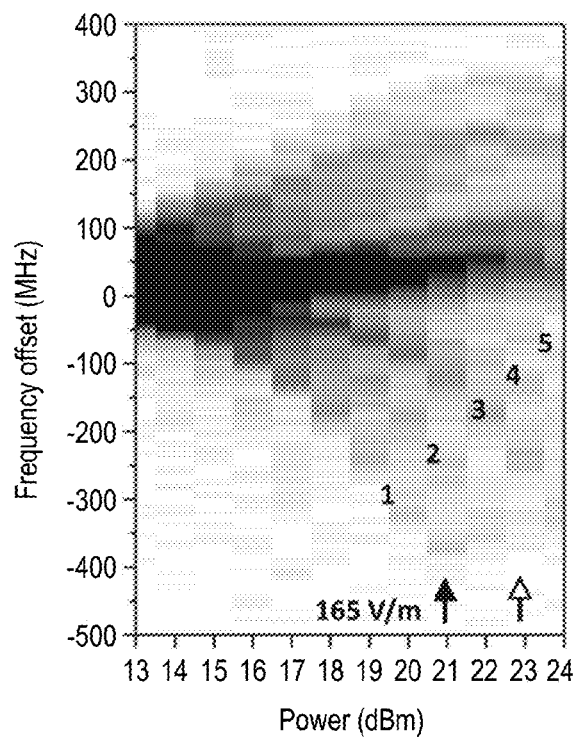
Figure 11B:
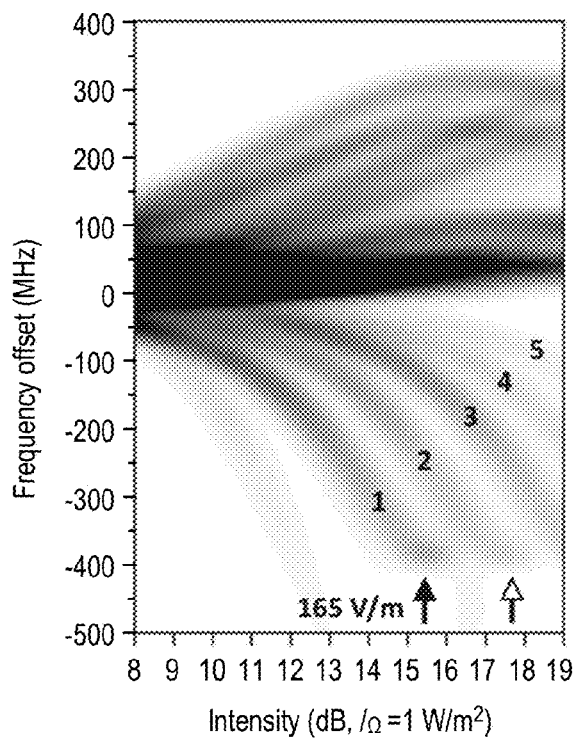

EIT system;

FIG. 6 is a graph showing an EIT-signal as a function of $\Delta_p$ for the EIT system $5S_{1/2}$-$5P_{3/2}$-$28D_{5/2}$, and a signal when the $28D_{5/2}$ level is coupled to the $29P_{3/2}$ level by a 104.77 GHz RF field;

FIG. 7 is a graph showing experimental data for the measurement for Δf at 17.04 GHz;

FIG. 8 is a graph showing a comparison of experimental data to both numerical simulations and to far-field calculations for 15.59 GHz, 17.04 GHz, and 104.77 GHz;

FIGS. 9A and 9B show weak-field measurement of 132.6495 GHz mm waves on the $26D_{5/2}$-$27P_{3/2}$ one-photon transition versus $\sqrt{\text{power}}$; and a strong-field measurement of 12.461 154 8 GHz microwaves on the 65D-66D two-photon transition versus power, respectively;

FIG. 10 is a graph showing the calculated $|m_j|$=1/2 (black circles) and 3/2 (red circles) Floquet quasienergies and their relative excitation rates (circle area) from $5P_{3/2}$;

FIG. 11A shows an experimental spectra of the 65D-66D two-photon transition versus microwave power; and FIG. 11B shows a composite Floquet map model of FIG. 11A.

Corresponding reference numerals indicate corresponding parts throughout the several views of the drawings.

DETAILED DESCRIPTION

Example embodiments will now be described more fully with reference to the accompanying drawings.

Figure 1:
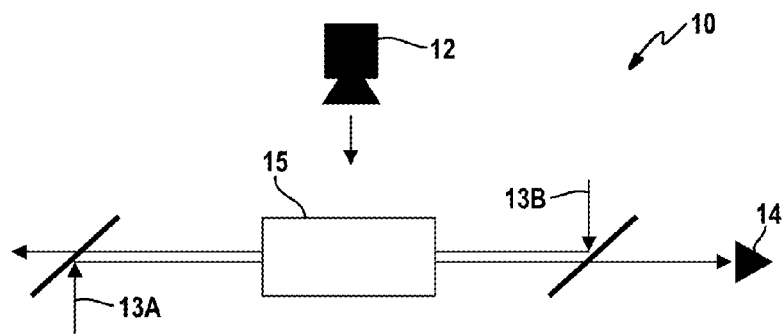
FIG. 1 is a diagram depicting an example measurement system.

With reference to FIGS. 1 and 2, the basic concept for measuring the electric field of electromagnetic radiation is presented. FIG. 1 depicts an example measurement system 10. The measurement system 10 is comprised generally of a source of electromagnetic radiation 12, one or more light sources 13, a light detector 14 and atoms of a known type contained in a vacuum enclosure 15. In this example, a probing light beam is provided from a probing light source 13A and a coupling light beam is provided from a coupling light beam 13B. The atoms serve as the active medium for the measurement probe. In this example, rubidium-85 ($^{85}$Rb) atoms are chosen as the active medium although other types of atoms fall within the scope of this disclosure, especially alkali atoms and those having a sufficiently high vapor pressure at room temperature.

Figures 2A, 2B:
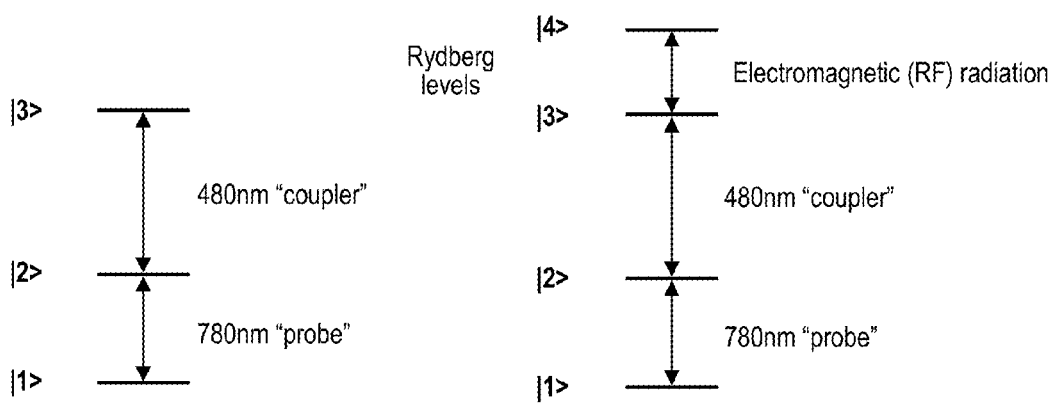
FIGS. 2A and 2B are diagrams illustrating 3-level and 4-level atomic systems, respectively.

The measurement method is demonstrated using electromagnetically transparency (EIT) in an atomic vapor or gas as an optical readout of atomic structure that is representative of the electric field or frequency of the electromagnetic radiation field of interest. Generally, an atom can be in different states with associated energies (levels). This is illustrated in FIG. 2 where the states of an atom are designated by |i>, where "i" is a given state. FIG. 2A shows the three levels of an atom relevant to the optical EIT readout of atomic structure. Here, the probe laser is resonant with the |1> to |2> transition (transition from a ground state to a first excited state) and a strong coupler laser is resonant with the |2> to |3> transition (transition from a first excited state to a Rydberg state). If the coupler laser is off, the probe laser gets scattered (absorbed and reemitted) by the atom. However, when the coupler laser is on, there is an increased transmission of the probe laser due to quantum interference of excitation pathways when both the probe is resonant with the |1> to |2> transition and the coupler is resonant with the |2> to |3> transition. This is the phenomenon of EIT. This provides a way to optically detect state |3> by measuring a change in the transmission of the probe through the atomic medium when, for example, the coupler laser is scanned in frequency through |2> to |3> resonance. Thus, state |3> is detected as a narrow (EIT) transmission peak in the probe absorption. With the appropriate choice of optical fields for the EIT, different atomic states (like |3> in this case) can be optically interrogated.

When an electromagnetic radiation field interacts with an atom, the atomic structure, or its energy levels, can change. How the atomic structure changes in this interaction depends on the nature (e.g. frequency and amplitude) of the electromagnetic radiation. FIG. 2B illustrates a special case of an interaction of the atom with an electromagnetic radio-frequency (RF) field that is weak and resonant between two Rydberg levels |3> and |4>. In the case that the applied RF field is weak, the interaction of the RF field with the atom leads to a change in the structure of the atomic energy levels (|3> and |4>) such that two dressed states are formed whose separation is proportional to the electric field amplitude of the RF source. In this case, one observes a splitting of the original EIT peak into two peaks. This splitting is known as Autler-Townes (AT) splitting which is related to the Rabi frequency $\Omega_{RF}$ of the |3)–|4) transition and applied field amplitude, and allows for a measurement of the E-field strength. In more general cases, for different RF frequencies and amplitudes, the structure of the atomic energy levels changes in different ways (not just a splitting) and more than just one or two energy levels may change. These changes in the atomic structure are also detected optically using EIT, providing a measured spectrum with different spectral features. The electric field or frequency of the electromagnetic radiation is then determined by matching the measured spectrum to a calculated spectrum in a set of predetermined spectra (previously calculated for the RF field frequency and amplitude range of interest) that uniquely corresponds to the electric field and frequency of the RF field. The match is achieved by comparing the spectral features (such as relative peak positions, peak heights, peak widths) of the measured spectrum to those of the calculated spectra in the set. The matched predetermined spectrum, which was calculated for a specific electric field amplitude and frequency, then provides the electric field amplitude and frequency of interest.

To measure the field strength (or amplitude) for different RF field frequencies, different states |3) and |4) can be chosen. State |3), with a state |4) to which the RF radiation field can couple, is selected by tuning the wavelength of the coupling laser. A large range of atomic transitions can be selected, allowing measurements of RF fields over a correspondingly wide selection of frequencies. In essence, the atoms act as a highly tunable, resonant, frequency selective RF detectors. This is a significant benefit of using Rydberg atoms as field probes. The wide range of states |3> selectable by the coupling laser and of states |4) available for RF measurement translates to the broadband nature of the probe, which allows RF measurements ranging from 10 MHz to 500 GHz.

Figure 3:
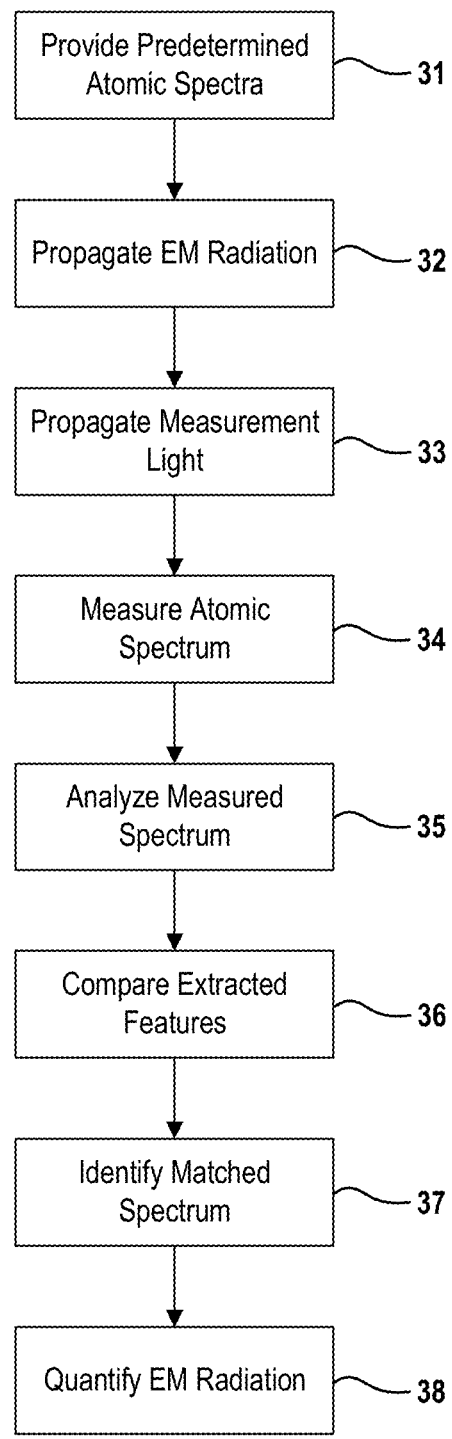
FIG. 3 is a flowchart illustrating a technique for measuring the electric field and/or frequency of electromagnetic radiation.

FIG. 3 depicts a proposed method for measuring the electric field (or frequency) of electromagnetic radiation using the response of Rydberg atoms. To obtain a measurement of the EM radiation E-field strength it is critical that the atomic response be accurately modeled over the desired range of EM radiation field frequencies and amplitudes. This is necessary so that a comparison of the experimentally observed spectra can be made and information on the nature of the EM radiation field can be obtained. The atomic response over a broad range of EM radiation field frequencies and field strengths varies from linear regimes (where there is a linear response of the atomic level shifts to the incident EM radiation field) to highly non-linear regimes. Measurement of an arbitrary (unknown) EM radiation field therefore requires a complete model of a broad range of atom-field interactions. As a starting point, a set of predetermined atomic spectra are provided at 31 for atoms of a known type, where each of the predetermined atomic spectra models the response of the atoms to an electromagnetic radiation field. Techniques for calculating the predetermined atomic spectra are further described below.

Electromagnetic radiation is propagated at 32 from a source towards the atoms residing in an active measurement region. In one embodiment, the atoms are in a gas state contained in a vacuum enclosure, such as a vapor cell, which defines the active measurement region. Concurrently, light from one or more light sources is propagated at 33 through the atoms residing in the active measurement region, where the light includes at least one light field that is coupled to a Rydberg state of the atoms for measuring the atomic spectrum.

While the electromagnetic radiation is interacting with the atoms (or has interacted with the atoms), an atomic spectrum is measured at 34 using the light from the one or more light sources. In the example embodiment, the atomic spectrum is measured using electromagnetically induced transparency as is further described below. In other embodiments, the atomic spectrum can be measured by (1) absorption spectroscopy, wherein the spectrum is obtained by monitoring the absorption of a light beam through the medium of atoms, (2) Rydberg-atom counting via charged particle detectors or current measurement devices, wherein the Rydberg atoms are ionized and resulting charges are detected by a measurement device. Other techniques for measuring an atomic spectrum also fall within the scope of this disclosure.

Next, the measured atomic spectrum is analyzed at 35 to extract spectral features. In one example, the peaks in the measured spectrum are numerically fit to Gaussians to extract features including relative peak positions, peak heights, and peak widths. Other techniques for extracting spectral features from the measured atomic spectrum are also contemplated by this disclosure.

Extracted spectral features from the measured spectrum are then compared at 36 to the spectral features of the predetermined atomic spectra. For example, the predetermined spectra shown as dots in FIGS. 9A and 9B contain information on the relative peak positions (signal positions along the vertical axes) and relative peak heights (size of blue dot) for two fixed electromagnetic radiation field frequencies (i.e., 132.6495 GHz in FIG. 9A and and 12.461 GHz in FIG. 9B) and different electric field amplitudes for each (top axes). Measured spectra are represented in gray scale in FIGS. 9A and 9B for different output powers of the electromagnetic radiation source. Note a single measured spectrum for a specific output power is a vertical trace in the respective plot, with signal strength represented on a gray scale. The relative positions of the signal peaks in each measured spectrum are matched at 37 to the calculated spectrum with the closest relative peak positions. It is envisioned that other spectral features in the measured spectrum, such as peak height or peak width, can be used to determine the best match with a calculated spectrum. From the matched calculated spectrum, the electric field (or frequency) of the electromagnetic radiation is quantified as indicated at 38. In this example, the field strength is read from the scale above the plot. It is to be understood that only the relevant steps of the methodology are discussed in relation to FIG. 3, but that other steps, including software-implemented instructions, may be needed to control and manage the overall operation of the measurement system 10.

In the example embodiment, the measurement system 10 further includes a data processor (e.g. computer) and a data store (e.g., non-transitory computer memory). The data processor is in data communication with the light detector and configured to receive a measure of the atomic spectrum from the light detector. The steps of analyzing the measures atomic spectrum, comparing the spectral features from the measured atomic spectrum to the spectral features of the predetermined atomic spectra, and matching the measured atomic spectrum to a given spectrum in the predetermined atomic spectra can be implemented by the data processor. The predetermined atomic spectra are stored in the data store for use by the processor.

Alternatively, within the limit of weak and resonant electromagnetic radiation fields, the electric field can be obtained by a direct measurement of the splitting between two peaks. The splitting is proportional to the electric field and the predetermined dipole moment of the transition between the resonantly coupled states. In this way, the electric field can be computed from the Rabi frequency as further described below.

The method to determine the properties of an electromagnetic radiation field from an optically measured atomic spectrum relies on having accurate models of the atomic response (spectra) over the field amplitude and frequency range of interest. Two models of the atomic response to electromagnetic radiation fields are described and validated experimentally. First, a perturbative model of the atomic response is implemented that is valid for the special case of weak electromagnetic radiation fields that are resonant or near-resonant with an atomic transition. Second, a complete non-perturbative model based on Floquet theory is described that is valid over the full range from weak to strong electromagnetic fields that are either on resonance or off-resonance with any atomic transition.

First, a simple model is implemented for use within the limit of weak EM fields resonant with an electric-dipole transition between the optically excited Rydberg level |3⟩ with another Rydberg level |4⟩. Here, the EM field splits the Rydberg-atom spectrum into two lines, known as the Autler-Townes effect. An example of such a splitting is seen in FIG. 6. In the limit of weak fields where higher-order effects can be neglected, the splitting between the line pair, $\Delta f$, is identical with the Rabi frequency ($\Omega_{RF}=2\pi\Delta f$) of the transition from level |3⟩ to level |4⟩, and the electric field of the EM radiation is given by $$|E_{RF}| = \frac{\hbar}{\wp RF}\Omega_{RF} = \frac{\hbar}{\wp RF}2\pi\Delta f \quad (1)$$

where the unknown field, $E_{RF}$, is proportional to the splitting, Planck's constant, and inversely proportional to the transition dipole moment $\wp_{RF}$, which quantifies the atomic response to the resonant field within this weak-field limit. The unknown field strength is calculated using first principles, for example with the method given by T. F. Gallagher in "Rydberg Atoms", Cambridge University Press, 1994. For embodiments based on rubidium atoms, in the calculation of the dipole moment $\wp_{RF}$, one can use quantum defects described by W. Li et al in "Millimeter-wave spectroscopy of cold Rb Rydberg atoms in a magneto-optical trap: Quantum defects of the ns, np and nd series" and by M. Mack et al in "Measurement of absolute transition frequencies of 85Rb to nS and nD Rydberg states by means of electromagnetically induced transparency".

When using room-temperature vapor cells and scanning the probe laser frequency, differential Doppler shifts between the probe and coupling beams alter the frequency separations between EIT peaks in the probe transmission spectrum. Splittings of $5P_{3/2}$ hyperfine states are scaled by $1-\lambda_c/\lambda_p$ while splittings of Rydberg states are scaled by $\lambda_c/\lambda_p$. The latter factor is relevant to measurements of RF-induced splittings of EIT peaks and therefore is modified. With reference to FIG. 6, the frequency splitting of the EIT peaks in the probe spectrum, $\Delta f$, is measured and the E-field amplitude is then given by $$|E_{RF}| = 2\pi\frac{\hbar}{\wp RF}\frac{\lambda_p}{\lambda_c}\Delta f \quad (2)$$

In the weak-field regime, predetermined spectra can be calculated with this model for a fixed electromagnetic radiation frequency, associated dipole moment, and range of electric field amplitudes. A measured spectrum, like the one shown in FIG. 6 (labeled "RF on"), is fit with a double Gaussian fitting function to extract spectral features of the measured spectrum including the splitting of the peaks. Here, the predetermined spectra can then be searched for the predetermined spectrum with a splitting that most closely matches the spitting of the measured spectrum. The matched predetermined spectrum then provides the electric field amplitude value corresponding to the measured splitting. Further, in the weak-field regime of the atom-field interaction, where Equations (1) or (2) are valid, the electric field amplitude can be obtained from the splitting of the peaks of the measured spectrum. In the weak-field regime, the search and match process amounts to dividing/multiplying with the predetermined dipole moment, Planck's constant, and any Doppler correction factors.

In an example embodiment, the measurement system relies upon on rubidium-85 ($^{85}$Rb) atoms as the active medium. As such, the probe light is a 780 nm ("red") laser and the |1⟩ to |2⟩ atomic resonance corresponds to the $5S_{1/2}$-$5P_{3/2}$ transition. To ensure that the |3⟩ to |4⟩ atomic resonance in $^{85}$Rb is an RF transition, the |2⟩ to |3⟩ transition will correspond to a ~480 nm ("blue") laser. Inset of FIG. 7 depicts a four-level atomic system. FIG. 7 shows the measured $\Delta f$ as a function of the square root of the RF signal generator (labeled as $\sqrt{P_{SG}}$). It can be seen that the measured $\Delta f$ is linear with respect to $\sqrt{P_{SG}}$ (noting $|E|\propto\sqrt{P_{SG}}$), as predicted for the case of weak fields. With the measured splitting $\Delta f$, and the calculated electric-dipole matrix element, the absolute field strength at the location for the lasers is obtained. Examples for three different RF fields, of different frequencies, are shown in FIG. 8 with a calculation of the expected electric field amplitude following Equation 2, validating this model of the atom-field interaction in this weak-field regime and its implementation in measuring the electric field amplitude.

Figure 4:
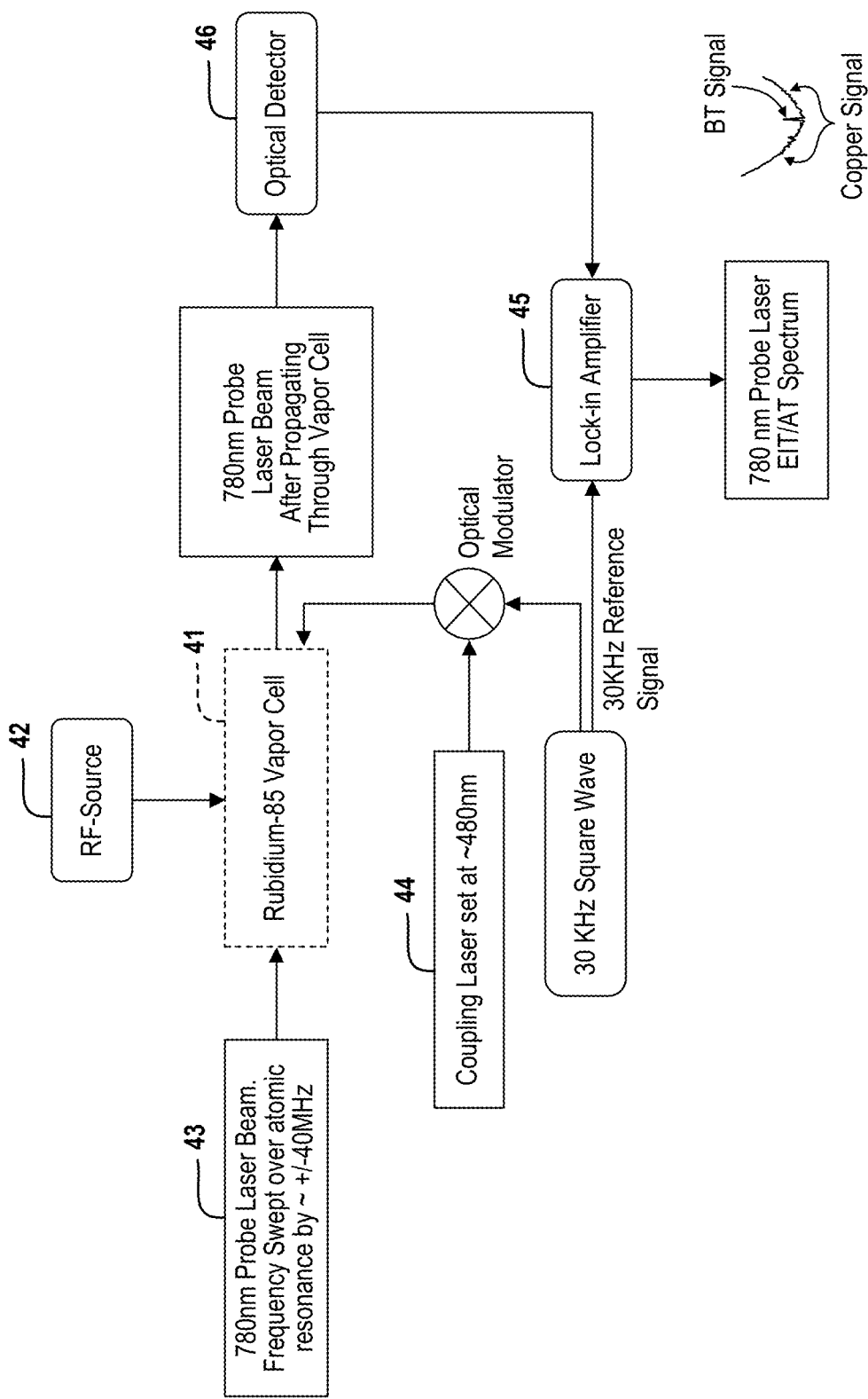
FIG. 4 is a block diagram of an experimental set up for the proposed electric field measurement technique.

An experimental setup used to demonstrate this optical measurement approach is shown in FIG. 4. The experimental setup included a vapor cell 41, a horn antenna 42 (and a waveguide antenna is used for the higher frequency measurements), a probe laser 43, and a coupling laser 44, a lock-in amplifier 45, and a photo diode detector 46. In this example, the vapor cell is a glass cylinder with a length 75 mm and a diameter 25 mm containing ($^{85}$Rb) atoms. The levels |1⟩, |2⟩, |3⟩, and |4⟩ correspond, respectively, to the $^{85}$Rb 5S$_{1/2}$ ground state, 5P$_{3/2}$ excited state, and two Rydberg states. The probe laser is a 780 nm laser which is scanned across the 5S$_{1/2}$-5P$_{3/2}$ transition. The probe beam is focused to a full-width at half-maximum (FWHM) of 80 μm, with a power of order 100 nW to keep the intensity below the saturation intensity of the transition. FIG. 5 shows a typical transmission signal as a function of relative probe detuning $\Delta_p$. The global shape of the curve is the Doppler absorption spectrum of $^{85}$Rb at room temperature. To produce an EIT signal, a counterpropagating coupling laser (wavelength $\lambda_c \approx 480$ nm, "blue") is applied with a power of 22 mW, focused to a FWHM of 100 μm. As an example, tuning the coupling laser near the 5P$_{3/2}$-50D$_{5/2}$ Rydberg transition results in distinct EIT transmission peaks as seen in FIG. 5. The strongest peak at $\Delta_p=0$ is labeled as "EIT signal".

In order to improve the signal-to-noise ratio, heterodyne detection can be used. The blue laser amplitude is modulated with a 30 kHz square wave and any resulting modulation of the probe transmission is detected with a lock-in amplifier. This removes the Doppler background and isolates the EIT signal as shown in the black curve of FIG. 6 (labeled as "RF off"). Here, the coupling laser is tuned near the 5P$_{3/2}$-28D$_{5/2}$ transition ("blue" with $\lambda_c \approx 482.63$ nm). Application of a RF field at 104.77 GHz to couple states 28D$_{5/2}$ and 29P$_{3/2}$ splits the EIT peak as shown in the gray curve (labeled as "RF on"). Using this heterodyne detection technique in the experimental data presented below results in measured EIT-signals with improved signal-to-noise ratio.

In weak RF-fields, the Rydberg levels are dynamically (ac) Stark-shifted and, in the case of a near- or on-resonant drive of a Rydberg transition, exhibit Autler-Townes splittings. For single-photon transitions in the weak-field limit, the RF E-field strength is directly proportional to the Autler-Townes splitting of the Rydberg EIT line, which is given by the Rabi frequency $\Omega_{RF} = \wp_{RF} \cdot E_{RF}/\hbar$, where here again so $\wp_{RF}$ is the Rydberg transition dipole moment and $E_{RF}$ is the RF radiation E-field vector.

FIG. 9A shows, as another example, experimental spectra for the on-resonant one-photon 26D$_{5/2}$-27P$_{3/2}$ mm-wave (132.6495 GHz) transition as a function of the square root of mm-wave power. This is similar to the previous example but for a higher frequency electromagnetic radiation field. Here, the EIT coupling-laser frequency is resonant with the mm-wave-free $^{85}$Rb 5P$_{3/2}$(F'=4)–26D$_{5/2}$ transition, where F' denotes the intermediate-state hyperfine component. As expected in weak RF fields, $\Omega_{RF}$ is a linear function of the square root of power (which is proportional to $E_{RF}$), making the splitting an excellent marker for an electric field value associated with that splitting. The faint level pairs centered at about –70 and –110 MHz correspond to spectra associated with the intermediate 5P$_{3/2}$(F'=2, 3) hyperfine components. From the measured spitting, using $\Omega = \wp_{RF,z} E_z/\hbar$ and the predetermined values of the dipole moments for a z-polarized field d$_z$ (405ea$_0$ for magnetic quantum number m$_j$=1/2 and this transition), the $E_{RF}$ fields obtained from the EIT spectra are in excellent agreement with the predetermined spectra calculated following Equation 2 (blue dots in FIG. 9). It is found that the maximum field amplitude measured in the experiment shown in FIG. 9A is 16 V/m, about 0.02% of the microwave-ionization field of these atoms and well within the weak-field limit.

In FIG. 9A, the predetermined spectra (shown in blue) contains the information on the relative peak positions for 132.6495 GHz mm-waves over a range of electric field amplitudes (top axis). Measured spectra are represented in gray scale in FIGS. 9A and 9B for different output powers of the electromagnetic radiation source. Note a single measured spectrum for a specific output power is a vertical trace in the respective plot, with signal strength represented on a gray scale. The measured spectra are plotted as a function of the square root of the output power, which is proportional to the electric field in this linear regime as described previously. Here, both the frequency axis and electric-field/root-power axis for the measured and calculated spectra have the same, fixed relative step sizes.

To search the calculated spectra for a match with the measured spectra, the calculated spectra are overlaid on the measured spectra. The calculated spectra are first shifted vertically until the symmetry points between the measured and calculated splittings are equal. The calculated spectra are then shifted horizontally until the splittings of the measured and calculated spectra are equal. A match is obtained between the measured and calculated spectra under the criterion that the splitting of a calculated spectrum is equal to the measured spectrum within a fraction of the linewidth of the measured spectrum. Once the match is obtained, the measured spectrum is now linked to the electric field associated with the matched predetermined spectrum, thereby quantifying the electromagnetic radiation electric field for that measured spectrum. In FIG. 9A, all of the measured spectra were matched simultaneously. However, it is envisioned that individual or a select number of measured spectra can be matched following the same approach.

In an alternative approach, a more general model is set forth to determine the atomic response to electromagnetic radiation fields. This more robust model can be used in the strong field regime, but it also applies to the weak field regime as well, and for on-resonance and off-resonance fields. To illustrate the atomic response in strong fields, measured and calculated atomic spectra for Rydberg atoms that have been strongly driven at the zero-field 65D$_{5/2}$-66D$_{5/2}$ two-photon resonance frequency (12.461 154 8 GHz) have been studied. This two-photon Rydberg transition is chosen to accommodate high-power microwaves in the K$_u$ band. FIG. 9B shows experimental EIT spectra centered on the 65D level for injected microwave powers ranging from 13 to 24 dBm in steps of 1 dBm. The 12 data sets are plotted as a function of power. For this high-power measurement, the microwave-induced shifts are in the range of several hundred MHz, i.e., about a factor of 10 larger than the shifts of the low-power measurement in FIG. 9A. As detailed below, the maximum field reached in FIG. 9B is 230 V/m, about 20% of the microwave-field-ionization limit for that case. It is noted that the field-free fine structure of the 65D and 66D states (approximately 40 MHz) is broken up in the strong-field regime because it is small compared to the microwave-induced shifts. This aspect heralds the greater complexity of high-power Rydberg EIT spectra compared to low-power spectra, as evidenced by the comparison of FIG. 9A with FIG. 9B.

At the lowest microwave power in FIG. 9B, the microwave interaction broadens the 65D EIT resonance to a FWHM width of 2π×50±1 MHz, which is a factor of 2 larger than that of the microwave-free EIT resonance (not-shown). For increasing microwave power, the EIT signal splits into multiple distinguishable spectral lines. For two-photon transitions, the two-photon Rabi frequency $\Omega_{RF} \sim E_{RF}^2$. Hence, the lines are expected to shift linearly as a function of RF power. Most levels in FIG. 9B exhibit linear shifts up to microwave powers of approximately 70 mW.

In strong fields, higher-order couplings lead to a redistribution of oscillator strength between many field-perturbed Rydberg states, resulting in smaller signal strengths compared to those in weak fields. This is reflected in FIG. 9B, where one observes a rapid initial decrease in the signal strength; over the first 30-mW increase in microwave power, the peak signal strengths of the individual spectral lines reduce by more than an order of magnitude. As the microwave power is increased further, the shifts of the spectral lines become nonlinear in power, reflecting substantial state mixing and higher-order couplings. The transition from linear to nonlinear behavior occurs gradually as a function of power, also, the details of this transition varies from level to level. As seen by close inspection of FIG. 9B, even at the lowest powers most levels exhibit some degree of nonlinearity. A quantitative model of the complex level structure in the strong-field regime is described below.

Inhomogeneous fields within the measurement volume contribute to the background and additional spectral lines, which are observed in FIG. 9B. The field inhomogeneity is attributed in part to the presence of the dielectric cell, and to the fact that the measurement is done in the near-field of the microwave horn. The effects of the field inhomogeneity are also discussed in detail in sections below.

In strong fields, where typical Rabi frequencies approach or exceed atomic transition frequencies, high-order couplings become significant and perturbative approaches are no longer valid. To model the strong-field experimental spectra, a (non-perturbative) Floquet method is adequate. Following the Floquet theorem, the solutions to Schrödinger's equation for a time-periodic Hamiltonian $\hat{H}(t)=\hat{H}(t+T)$, where T is the period of the rf field, are of the form $$\Psi_v(t)=e^{-iW_v t/\hbar} \quad (13)$$

Here, $\Psi_v(t)=\varphi_W(t+T)$ are the periodic Floquet modes and $W_v$ their quasienergies, with an arbitrary model label v. For the atom-field interaction strength of interest here, the Floquet modes can be represented using standard basis states $|n,l,j,m_j\rangle=|k\rangle$, i.e., $$\Psi_v(t)=e^{iW_v t/\hbar}\Sigma_k C_{v,k}(t)|k\rangle \quad (14)$$

with time-periodic (complex) coefficient functions that satisfy $C_{v,k}(t)=C_{v,k}(t+T)$. The Floquet energies $W_v$ and states $\Psi_v(t=0)$ are determined by finding the eigenvalues and vectors of the time-evolution operator $\hat{U}(t,T+t)$. The coefficient functions $C_{v,k}(t)$ are then obtained by integrating $\Psi_v(t)$ over one period of the RF field, $t\in[0, T]$.

In the laser excitation of Floquet states from the intermediate $5P_{3/2}$ state, multiphoton processes are important because the atom may emit or absorb a number of microwave photons together with an optical photon. To compute excitation line strengths, the above functions $C_{v,k}(t)$ are Fourier-expanded:

$$\Psi_v(t) = e^{-iW_v t/\hbar}\sum_k \sum_{N=-\infty}^{\infty} \tilde{C}_{v,k,N} e^{-iNw_{rf}t}|k\rangle,$$

$$\tilde{C}_{v,k,N} = \frac{1}{T}\int_0^T C_{v,k}(t)e^{iNw_{rf}t}\,dt. \quad (15)$$

The integer N is interpreted as a number of microwave photons with frequency $\omega_{rf}$ associated with the bare atomic state. The laser frequencies $\omega_L$, where Floquet levels are resonantly excited from the $5P_{3/2}$ level, and the corresponding line strengths $S_{v,N}$ are then given by:

$$\hbar w_L = W_v + N\hbar w_{rf},$$

$$S_{v,N}=(eE_L/\hbar)^2|\Sigma_k \tilde{C}_{v,k,N}\hat{\varepsilon}\cdot\langle k|\hat{r}|5P_{3/2},m_j\rangle|^2, \quad (16)$$

where $E_L$ is the amplitude of the laser E field, $\hat{\varepsilon}$ is the laser-field polarization vector, and $\langle k|\hat{r}|5P_{3/2},m_j\rangle$ are the electric-dipole matrix elements of the basis states with $|5P_{3/2},m_j\rangle$. Each Floquet level $W_v$ leads to multiple resonances, which are associated with the microwave photon number N. Because of parity, in the absence of additional static fields, a Floquet level $W_v$ may generate resonances for either even N or odd N but not both.

In FIG. 10, calculated Floquet energies and excitation rates $S_{v,N}$ are shown in the vicinity of the 65D Rydberg level for a microwave frequency of 12.461 154 8 GHz and field strengths ranging from 0 to 350 V/m. The field is displayed on a quadratic scale to show the dependence of the atomic-level shifts on power and for direct comparison with FIG. 9B. Over the limited frequency range displayed in FIG. 10, it is always N=0. Further inspection of the calculated Floquet energies and excitation rates, not presented in detail here, shows that for fields above approximately 150 V/m several Floquet levels $W_v$ visible in FIG. 10 have copies with high excitation rates for even values of N between about −8 and +8.

The Floquet modes in strong fields exhibit nontrivial wave-packet motion, and their optical excitation rates have to be calculated according to Eq. (16). Low-field approximations along the lines of Equations (1) and (2) are not valid. It would, for instance, be incorrect to associate the excitation rates of the Floquet modes in FIGS. 10 and 11, with the 65D probabilities the modes carry. To qualitatively explain this, it is noted that in weak fields the dressed-state coefficients and dipole moments have fixed amplitudes and phases relative to the field (in the field picture and using the rotating-wave approximation). In strong fields, wave-function coefficients and dipole moments vary significantly throughout the microwave-field cycle. Specifically, the Floquet modes are time-periodic wave packets that are synchronized with the driving rf field.

In FIG. 9B, one finds an excellent overall agreement between dominant features in the experimental and theoretical Floquet maps. Additional features evident in the experimental map are due to E-field inhomogeneities, which are discussed below. Both experimental and theoretical maps exhibit several arched lines at positive frequencies and, at negative frequencies, several lines that shift approximately linearly in power. The dominant downshifting line suddenly terminates at close to −400 MHz. It is evident from FIG. 10 that the sudden termination of the downshifting lines is due to a wide Floquet avoided crossing. Avoided crossings in Floquet maps, such as those in FIG. 10, provide convenient markers for spectroscopic determination of the rf E field on an absolute scale. In the present case, the prominent avoided crossing at 165 V/m (see label 2 in FIG. 10) has several matching locations in the experimental spectrum shown in FIG. 19B. These are seen more clearly in FIG. 11A, which shows the experimental data on a dBm scale. The appearance of multiple copies of the calculated avoided crossing in the experiment points to the fact that the microwave field within the cell had multiple dominant domains, each of which produced its own rendering of the avoided crossing. The rendering at the lowest injected microwave power corresponds to the E field domain with the highest field at a given injected power [calculation and E field axis shown in FIG. 9B]. In FIG. 9B, the avoided crossing is observed first at 130 mW, at which point the domain that has the highest field reaches 165 V/m. It follows that at a microwave power of 250 mW a maximum RF E field of 230±14 V/m is reached. The uncertainty of this value is given by half the experimental power step size (±0.5 dB, corresponding to ±6% in field).

Using Floquet models, a method for measuring the electric field (or frequency) of electromagnetic radiation proceeds as follows. First, the Floquet model is used to calculate predetermined spectra for the electromagnetic radiation over the electric field and frequency ranges of interest. A measured spectrum, like any of the ones shown in FIG. 9B, is analyzed to extract spectral features of the measured spectrum including relative peak positions, peak heights, and peak widths. The predetermined spectra can then be searched for the predetermined spectrum with the features that most closely match those of the measured spectrum. For example, due to the complex non-linear features of the spectra, the search entails first shifting the overlaid calculated spectra vertically over the measured spectra so that the zero-field (RF off) calculated spectrum and measured spectrum are both at the same frequency (zero in the plot). The calculated spectrum is then shifted horizontally until the positions of the various peaks in the measured and calculated spectra overlap. In this example, the predetermined spectra are calculated at a fixed frequency over a range of field strengths. By matching the measured spectrum to the calculated predetermined spectra, one can quantify the electric field of the electromagnetic radiation field associated with each of the measured spectra. The quality of the overlap and match is determined by how well the peak positions of the calculated spectra fall within the measured peak positions. Different criteria for this match will result in different uncertainties in the final field value. In one example, the criterion is that the calculated peak should fall within the full width half maximum of the measured signal. In this example, the uncertainty is dominated by the experimental step size, not the matching criteria. There are also considerations of unaccounted for peaks in the spectra due to, for example, field inhomogeneities, which can also be modelled. It is emphasized that the matching process is necessary to obtain the electric field for atomic spectra in a medium to strong field regime where simple models like Equations 1 and 2 do not apply. The proposed approach provides a more general way to measure such properties of the electromagnetic radiation field of interest. As before, the described process is for matching a series of measured spectra at the same time. A single measured spectrum can be matched to a predetermined spectrum following a similar procedure.

Furthermore, a measurement of the frequency of the electromagnetic radiation field can be achieved by calculating predetermined spectra at a fixed electric field value for a range of electromagnetic field frequencies. This results in predetermined spectra that are linked to the frequency for the radiation field that can then be search and matched with a measured atomic spectra as described above to obtain a value for the electromagnetic field frequency. A simultaneous measurement of electric field and frequency can also be achieved by calculating a series of predetermined calculated spectral maps like the ones shown in FIG. 9 for a range of frequencies. This would result in a larger set of predetermined spectra that can be searched in both frequency and field amplitude for a match with the measured spectrum.

In the following sections, an explanation is provided of the analysis used to model the experimental spectra plotted in FIGS. 9B and 11A. The spectra contain information on the continuous distribution of the microwave E field strength along the length of the EIT probe and coupling beams passing through the spectroscopic cell. The microwave boundary conditions are symmetric about the xy plane, with the incident microwave E field being z polarized and the optical beams propagating along the x axis. Since the microwave field is primarily z polarized along the optical beams, it drives $\Delta m_j=0$ Rydberg transitions with the $m_j=\pm1/2$ and $m_j=\pm3/2$ manifolds of states. The field distribution is a result of superpositions of reflections from the cell walls. Also, the cell is placed within the near field of the source, leading to additional variability of the microwave field along the probe beam. Hence, one may picture the RF field as a speckle pattern, akin to speckle patterns seen for general, nonideal coherent fields. Here, one should expect the number of speckles to be on the order of the cell length divided by the wavelength, which in this case is 3. Also, since there are no structures within the cell that are very close to the optical probe beam path, one would not expect any sharp spatial features in the microwave E field (features which might otherwise arise from sharp metallic or dielectric edges and the like). Therefore, for each theoretical line in FIG. 10, the measured EIT spectra are expected to exhibit a small number of spectral features that correspond to the local maxima and minima of the microwave field along the length of the probe beam.

Based on the observation of five downward spectral lines [labeled in FIG. 11A] and the fact that the calculated spectrum has only one corresponding downward line (feature 1 in FIG. 10), the spectrum is modeled considering populations of atoms located within a set of five dominant microwave E field regions. In the model, the probability distribution for intensity on a decibel scale is given by $$P_{dBi}(s)=\Sigma_{|m_j|=1/2}^{3/2}\Sigma_{k=1}^{5}w_{m_j}(|m_j|)w_k(k)P_{dBi0}(s+\Delta s_k). \qquad (17)$$

Here, k is an index for the five microwave field domains, $w_k(k)$ is the probability that an atom contributing to the signal resides within domain k, $w_{m_j}(|m_j|)$ is the probability that an atom contributing to the signal has a magnetic quantum number $|m_j|$, and $P_{dBi0}$ is a Gaussian point-spread function that accounts for inhomogeneous spectral broadening within the five domains. The values $\Delta s_k$ indicate by what amount (in decibels) the central microwave intensity within the kth microwave field region is shifted relative to the intensity in the highest-intensity (k=1) domain. For $P_{dBi0}$, it is assumed a Gaussian that is the same for all k. The fit parameters in the model are $\Delta s_k$, $w_{m_j}, w_k$, and the standard deviation $\sigma_{dBi0}$ for $P_{dBi0}$. One can account for the optical EIT line broadening and laser line drifts by a Gaussian spread function in frequency, $P_\nu(\nu)$, which has a standard deviation $\sigma_\nu$. From the theoretical spectrum $S_T(s, \nu)$, the model spectrum $S_E(s_0 s_\nu)$ is then given by the convolution $$S_E(s_0,\nu_0)=\int S_T(s_0-s',\nu_0-\nu')P_\nu(\nu')P_{dBi}(s')d\nu'ds', \qquad (18)$$

where the intensities in the arguments of $S_E$ and $S_T$ are measured in dBi, defined as $10 \log_{10} [I/(W/m^2)]$, where I is the RF field intensity.

FIG. 11B shows the model spectrum $S_E(s_0, \nu_0)$ in dBi for the data in FIG. 11A. In the model spectrum, the field domains have empirically fitted intensity shifts of $\Delta_{s_k}=0.0$, −2.0, −4.17, −6.0, and −8.0 db for k=1, . . . , 5. The corresponding fitted weighting factors are $w_k$=0.39, 0.21, 0.27, 0.09, and 0.04. The intensity shifts are significant to better than about 0.5 dB, while the weighting factors are significant to better than about ±0.04. The weighting factors $w_{m_j}$ for the $|m_j|$=1/2 and 3/2 states are 0.7 and 0.3, respectively (significance level better than about 0.1). The larger $|m_j|$=1/2 weight likely results from optical pumping by the EIT probe field. Furthermore, $\sigma_{dBi}$=1 dBi and $\sigma_\nu$=30 MHz.

A comparison of the measured spectrum and the model spectrum in FIG. 11 shows that a strong-field Floquet analysis of the atomic physics of Rydberg atoms in microwave fields, combined with a straightforward empirical model of the microwave intensity distribution and the $|m_J|$ weighting in the sample, leads to remarkably good agreement between spectra with rather complex features. Utilizing a combination of resonant, strong electric-dipole transitions as in FIG. 9A and higher-order transitions such as the two-photon transition in FIG. 9B, it is possible to observe level shifts in Rydberg EIT spectra over a wide dynamic range of the applied RF intensity.

The models of the atom-field interactions described herein (Autler-Towns model and Floquet model) depend only on invariable atomic parameters such as quantum defects and dipole moments, and fundamental constants, such as Planck's constant. The method to determine the electric field or frequency of an unknown electromagnetic radiation field using these models therefore provides a measurement that is directly SI traceable in which the uncertainty of each step in the computation is well-characterized and documented. The uncertainty of the dipole moment calculation is considered to be less than 0.1%, so the overall traceability to SI units has a correspondingly small uncertainty, compared to previous E-field measurement techniques.

Since the spectroscopic response is well described by the Floquet theory laid out above, predetermined spectra for a chosen RF frequency and field amplitude range, and measured spectrum can be used together as described above to quantify the RF E field causing the observed spectral features in a calibration-free manner. Specifically, there are no antenna systems and readout instruments that need to be calibrated to translate a reading into a field, because spectral features such as line shifts and avoided crossings follow from the invariable nature of the underlying atomic physics. The field measurement precision is given by how well the spectral features are resolved. For instance, in the present disclosure, the avoided crossing pointed out by the arrows in FIGS. 10 and 11 can be resolved to within ±0.5 dBi uncertainty, corresponding to an absolute field uncertainty of ±0.6%.

While in the experimental examples shown here a cell on the order of 25 mm to 75 mm is used, the vapor cell can be made smaller and hence allow a compact probe (or sensor head).

Regardless of the size of the vapor cell, this technique allows for sub-wavelength imaging of an RF field over a large frequency range. This has been demonstrated where field distributions inside a glass cell were imaged at both 17.04 GHz and 104.77 GHz. The unique feature of this imaging approach is that the spatial resolution is not governed by the size of the vapor cell that holds the atoms. The RF field will only interact with the atoms that are exposed to the two laser beams. As such, the spatial resolution of this approach is based on beam widths of the two lasers used in this experiment, which can be in principle on the order of the diffraction limit, i.e., 10's of mircometers. The applications of such a small spatial imaging capability are numerous. For example, the sensing volume could be scanned over a printed-circuit-board (PCB) or a metasurface in order to map their fields, as well as other applications where E-field measurements on a small spatial resolution are desired.

The techniques described herein may be implemented in part by one or more computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

Some portions of the above description present the techniques described herein in terms of algorithms and symbolic representations of operations on information. These algorithmic descriptions and representations are the means used by those skilled in the data processing arts to most effectively convey the substance of their work to others skilled in the art. These operations, while described functionally or logically, are understood to be implemented by computer programs. Furthermore, it has also proven convenient at times to refer to these arrangements of operations as modules or by functional names, without loss of generality.

Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system memories or registers or other such information storage, transmission or display devices.

Certain aspects of the described techniques include process steps and instructions described herein in the form of an algorithm. It should be noted that the described process steps and instructions could be embodied in software, firmware or hardware, and when embodied in software, could be downloaded to reside on and be operated from different platforms used by real time network operating systems.

The present disclosure also relates to an apparatus for performing the operations herein. This apparatus may be specially constructed for the required purposes, or it may comprise a general-purpose computer selectively activated or reconfigured by a computer program stored on a computer readable medium that can be accessed by the computer. Such a computer program may be stored in a tangible computer readable storage medium, such as, but is not limited to, any type of disk including floppy disks, optical disks, CD-ROMs, magnetic-optical disks, read-only memories (ROMs), random access memories (RAMs), EPROMs, EEPROMs, magnetic or optical cards, application specific integrated circuits (ASICs), or any type of media suitable for storing electronic instructions, and each coupled to a computer system bus. Furthermore, the computers referred to in the specification may include a single processor or may be architectures employing multiple processor designs for increased computing capability.

The algorithms and operations presented herein are not inherently related to any particular computer or other apparatus. Various general-purpose systems may also be used with programs in accordance with the teachings herein, or it may prove convenient to construct more specialized apparatuses to perform the required method steps. The required structure for a variety of these systems will be apparent to those of skill in the art, along with equivalent variations. In addition, the present disclosure is not described with reference to any particular programming language. It is appreciated that a variety of programming languages may be used to implement the teachings of the present disclosure as described herein.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method for measuring the electric field of electromagnetic radiation using the spectroscopic responses of Rydberg atoms to the radiation to be measured, comprising:
calculating predetermined atomic spectra for atoms of a known type using non-perturbative Floquet theory;
propagating an unknown electromagnetic radiation field towards the atoms, where the atoms are in a gas state and contained in a vacuum enclosure;
propagating one or more light beams through the atoms, where at least one light beam is coupled to at least one Rydberg state of the atoms;
measuring an atomic spectrum using the one or more light beams while the unknown electromagnetic radiation is interacting with or has interacted with the atoms;
analyzing the measured atomic spectrum to extract spectral features;
comparing the spectral features from the measured atomic spectrum to spectral features of the predetermined atomic spectra; and
matching the measured atomic spectrum to a given spectrum in the predetermined atomic spectra, thereby quantifying one of field strength or frequency of the unknown electromagnetic radiation field.

2. The method of claim 1 wherein calculating predetermined atomic spectra for atoms of a known type using non-perturbative Floquet theory comprises a perturbative approximation to non-perturbative Floquet theory using second or higher-order perturbation theory.

3. The method of claim 1 wherein providing predetermined atomic spectra for atoms further comprises calculating the predetermined atomic spectra at a fixed frequency for a range of electric field values.

4. The method of claim 1 wherein providing predetermined atomic spectra for atoms further comprises calculating the predetermined atomic spectra at a fixed electric field for a range of frequencies.

5. The method of claim 1 wherein the atoms contained in the vacuum enclosure are maintained at a fixed temperature and density.

6. The method of claim 1 wherein a vacuum enclosure comprises a spectroscopic cell.

7. The method of claim 1 wherein measuring an atomic spectrum using the one or more light beams comprises measuring an atomic spectrum using electromagnetically induced transparency.

8. The method of claim 7 wherein measuring an atomic spectrum of the atoms further comprises
propagating a probing light beam through the atoms, where the probing light beam has a frequency resonant with transition of the atoms from a first quantum state to a second quantum state;
propagating a coupling light beam through the atoms simultaneously with the probing light beam, where the coupling light beam is overlapped spatially with the probing light beam, the frequency of the coupling light beam is scanned across a range in which atoms transition from the second quantum state to a Rydberg state; and
detecting the probing or coupling light beam passing though the atoms using a light detector.

9. The method of claim 1 wherein comparing the spectral features from the measured atomic spectrum further comprises overlaying the predetermined atomic spectra onto the measured atomic spectrum and shifting the predetermined atomic spectra such that the predetermined atomic spectra aligns with the measured atomic spectrum.

10. The method of claim 1 wherein the spectral features extracted from the measured atomic spectrum includes one or more of peak heights, peak widths and relative peak positions.

11. The method of claim 1 wherein comparing the spectral features from the measured atomic spectrum further comprises overlaying the predetermined atomic spectra onto the measured atomic spectrum, shifting the predetermined atomic spectra in relation to the measured atomic spectrum so that the spectral features are in agreement, thereby yielding the field strength or frequency of the unknown electromagnetic field.

12. The method of claim 1 further comprises analyzing the measured atomic spectrum to extract peak positions and comparing the peak positions from the measured atomic spectrum to peak positions of the predetermined atomic spectra.

13. The method of claim 1 further comprises analyzing the measured atomic spectrum to extract peak positions and comparing the peak positions from the measured atomic spectrum to peak positions of the predetermined atomic spectra by overlaying the predetermined atomic spectra onto the measured atomic spectrum and shifting the predetermined atomic spectra in relation to the measured atomic spectrum until the peak positions in the predetermined atomic spectra fall within full width half maximum of the peak positions in the measured atomic spectrum.

14. A method for measuring the electric field of electromagnetic radiation using the spectroscopic responses of Rydberg atoms to the radiation to be measured, comprising:
calculating predetermined atomic spectra for atoms of a known type using non-perturbative Floquet theory;
propagating an unknown electromagnetic radiation field towards the atoms, where the atoms are in a gas state and contained in a spectroscopic cell;
propagating one or more light beams through the atoms, where at least one light beam is coupled to a Rydberg state of the atoms;
measuring an atomic spectrum using electromagnetically induced transparency while the unknown electromagnetic radiation is interacting with or has interacted with the atoms;
analyzing the measured atomic spectrum to extract spectral features;
comparing the spectral features from the measured atomic spectrum to spectral features of the predetermined atomic spectra; and
matching the measured atomic spectrum to a given spectrum in the predetermined atomic spectra, thereby quantifying one of field strength or frequency of the unknown electromagnetic radiation field.

15. The method of claim 14 wherein comparing the spectral features from the measured atomic spectrum further comprises overlaying the predetermined atomic spectra onto the measured atomic spectrum and shifting the predetermined atomic spectra such that the predetermined atomic spectra aligns with the measured atomic spectrum.

16. The method of claim 14 wherein measuring an atomic spectrum of the atoms further comprises
propagating a probing light beam through the atoms, where the probing light beam has a frequency resonant with transition of the atoms from a first quantum state to a second quantum state;

propagating a coupling light beam through the atoms simultaneously with the probing light beam, where the coupling light beam is overlapped spatially with the probing light beam, the frequency of the coupling light beam is scanned across a range in which atoms transition from the second quantum state to a Rydberg state; and detecting the probing or coupling light beam passing though the atoms using a light detector.

17. A method for measuring the electric field of electromagnetic radiation using the spectroscopic responses of Rydberg atoms to the radiation to be measured, comprising:

calculating predetermined atomic spectra for atoms of a known type using a perturbative approximation to non-perturbative Floquet theory using second or higher-order perturbation theory;

propagating an unknown electromagnetic radiation field towards the atoms, where the atoms are in a gas state and contained in a vacuum enclosure;

propagating one or more light beams through the atoms, where at least one light beam is coupled to a Rydberg state of the atoms;

measuring an atomic spectrum using electromagnetically induced transparency while the unknown electromagnetic radiation is interacting with or has interacted with the atoms;

analyzing the measured atomic spectrum to extract spectral features;

comparing the spectral features from the measured atomic spectrum to spectral features of the predetermined atomic spectra; and matching the measured atomic spectrum to a given spectrum in the predetermined atomic spectra, thereby quantifying one of field strength or frequency of the unknown electromagnetic radiation field.

18. The method of claim 17 wherein comparing the spectral features from the measured atomic spectrum further comprises overlaying the predetermined atomic spectra onto the measured atomic spectrum and shifting the predetermined atomic spectra such that the predetermined atomic spectra aligns with the measured atomic spectrum.

19. The method of claim 17 wherein measuring an atomic spectrum of the atoms further comprises propagating a probing light beam through the atoms, where the probing light beam has a frequency resonant with transition of the atoms from a first quantum state to a second quantum state;

propagating a coupling light beam through the atoms simultaneously with the probing light beam, where the coupling light beam is overlapped spatially with the probing light beam, the frequency of the coupling light beam is scanned across a range in which atoms transition from the second quantum state to a Rydberg state; and detecting the probing or coupling light beam passing though the atoms using a light detector.

* * * * *